(12) United States Patent
Mahnad

(10) Patent No.: US 8,616,870 B2
(45) Date of Patent: Dec. 31, 2013

(54) OPTICAL MEDIA PRODUCTION SYSTEM AND METHOD FOR CONTROLLING SAME

(75) Inventor: Faramarz Mahnad, Brookline, MA (US)

(73) Assignee: Oracle International Corporation, Redwood City, CA (US)

( * ) Notice: Subject to any disclaimer, the term of this patent is extended or adjusted under 35 U.S.C. 154(b) by 229 days.

(21) Appl. No.: 12/750,164

(22) Filed: Mar. 30, 2010

(65) Prior Publication Data

US 2011/0241239 A1 Oct. 6, 2011

(51) Int. Cl.
*B29C 59/02* (2006.01)
(52) U.S. Cl.
USPC .......................... 425/135; 425/142; 425/145

(58) Field of Classification Search
USPC .......................................... 425/135, 142, 145
See application file for complete search history.

(56) References Cited

U.S. PATENT DOCUMENTS

| 6,226,088 B1* | 5/2001 | Keane ........................... 356/430 |
| 2005/0087578 A1* | 4/2005 | Jackson ............................. 226/3 |
| 2005/0123186 A1* | 6/2005 | Reeves et al. .................. 382/141 |
| 2008/0156421 A1* | 7/2008 | Lee et al. ....................... 156/184 |

* cited by examiner

*Primary Examiner* — James Sanders
(74) *Attorney, Agent, or Firm* — Brooks Kushman P.C.

(57) ABSTRACT

A nano-imprinting system may be configured to at least one of transport, emboss, coat and slit an optical media according to operational parameters. A control system may be configured to detect one or more attributes of the optical media that result from at least one of the embossing and coating of the optical media, and to adjust at least one of the operational parameters based on the detected one or more attributes.

8 Claims, 3 Drawing Sheets

OPTICAL MEDIA PRODUCTION SYSTEM AND METHOD FOR CONTROLLING SAME

BACKGROUND

Roll-to-roll nano-imprint lithography systems, such as platform 10 of FIG. 1, have been proposed as an efficient and effective method of pre-formatting optical tape media with imprint of nano-structure features such as land and groove and wobble patterns. These systems typically include several operational stages as shown in FIG. 1. The platform 10 includes a tape transport system 12 to move an optical tape media 14 through the different stages, and coating and sputtering stages 16, 18 to coat the media 14 with the appropriate embossing monomer and other chemicals. The platform 10 also includes an embossing stage 20 to imprint the desired pattern on the media 14, and a curing stage 22 to cure the embossed media 14. The platform 10 further includes a tension sensor 24 to sense a tension of the media 14, and a slitting stage 26 to cut the media 14. The tension sensor 24 is in communication with the transport system 12 to provide information regarding the tension of the media 14.

In this arrangement, the function of each operation is controlled by a set of operational parameters. Examples of typical operational parameters for the platform 10 include: for the transport system 12, adjustment associated with reel to reel motor control, tension control, guiding control and speed control of the media 14; for the coating and sputtering stages 16, 18, chemical dispense volume/frequency and process power; for the embossing stage 20, nip roller applied pressure and separation angle roller adjustment; for the curing stage 22, UV power and duration; and for the slitting stage 26, slitter guide position, etc.

Currently, the adjustment/selection of each of the above operational parameters is performed manually based on experimental estimation and observation. Resulting formatted media is inspected and tested after its production to verify its quality and imprinted pattern fidelity. If the result is satisfactory, the adjustments are set and applied to future production of the media. If the result is unsatisfactory, the adjustments are modified and the process is repeated until a satisfactory result is achieved.

SUMMARY

An optical media production system may include a roll-to-roll tape transport configured to move an optical media, and an optical media nano-imprinting platform. The platform may have operational parameters and be configured to at least one of guide, emboss, coat, and slit the media according to the operational parameters. The system may further include an optical scanner configured to detect one or more attributes of the media that result from at least one of the embossing and coating of the optical media, and a controller operatively arranged with the scanner. The controller may be configured to adjust at least one of the operational parameters based on the detected one or more attributes of the media.

A nano-imprinting system for an optical media may be controlled by operating the system according to operational parameters to at least one of transport, emboss, coat and slit the optical media, and by detecting one or more attributes of the optical media that result from at least one of the embossing and coating of the optical media. The system may be further controlled by automatically adjusting at least one of the operational parameters based on the detected one or more attributes.

A media production system may include a nano-imprinting system and a control system. The nano-imprinting system may be configured to at least one of transport, emboss, coat and slit an optical media according to operational parameters. The control system may be configured to detect one or more attributes of the optical media that result from at least one of the embossing and coating of the optical media, and to adjust at least one of the operational parameters based on the detected one or more attributes.

While example embodiments in accordance with the invention are illustrated and disclosed, such disclosure should not be construed to limit the invention. It is anticipated that various modifications and alternative designs may be made without departing from the scope of the invention.

Similarly numbered elements of the FIGS. may have similar, although not necessarily identical, descriptions. As an example, elements 20, 120 may share similar descriptions.

DETAILED DESCRIPTION

Manual adjustment and/or selection of roll-to-roll nano-imprint lithography system operational parameters may be time consuming and cumbersome to administer and control. Additionally, such manual adjustment and/or selection techniques are not dynamic and not applied in real time. Variation and drift at each of the stages may thus occur. Certain embodiments disclosed herein may implement an automatic operational parameter feedback and/or control system to improve throughput and quality of optical tape media production.

Figure 1:
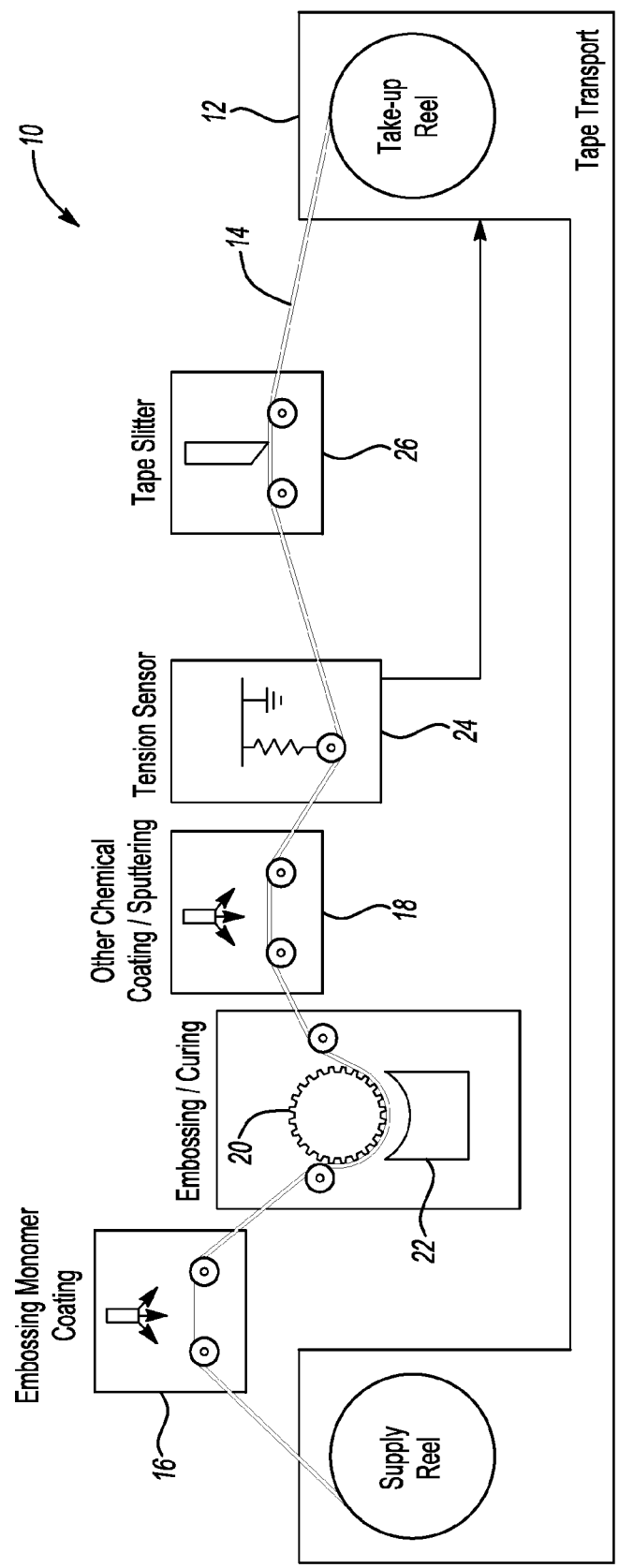
FIG. 1 is a block diagram of a roll-to-roll nano-imprint lithography system.
Figure 2:
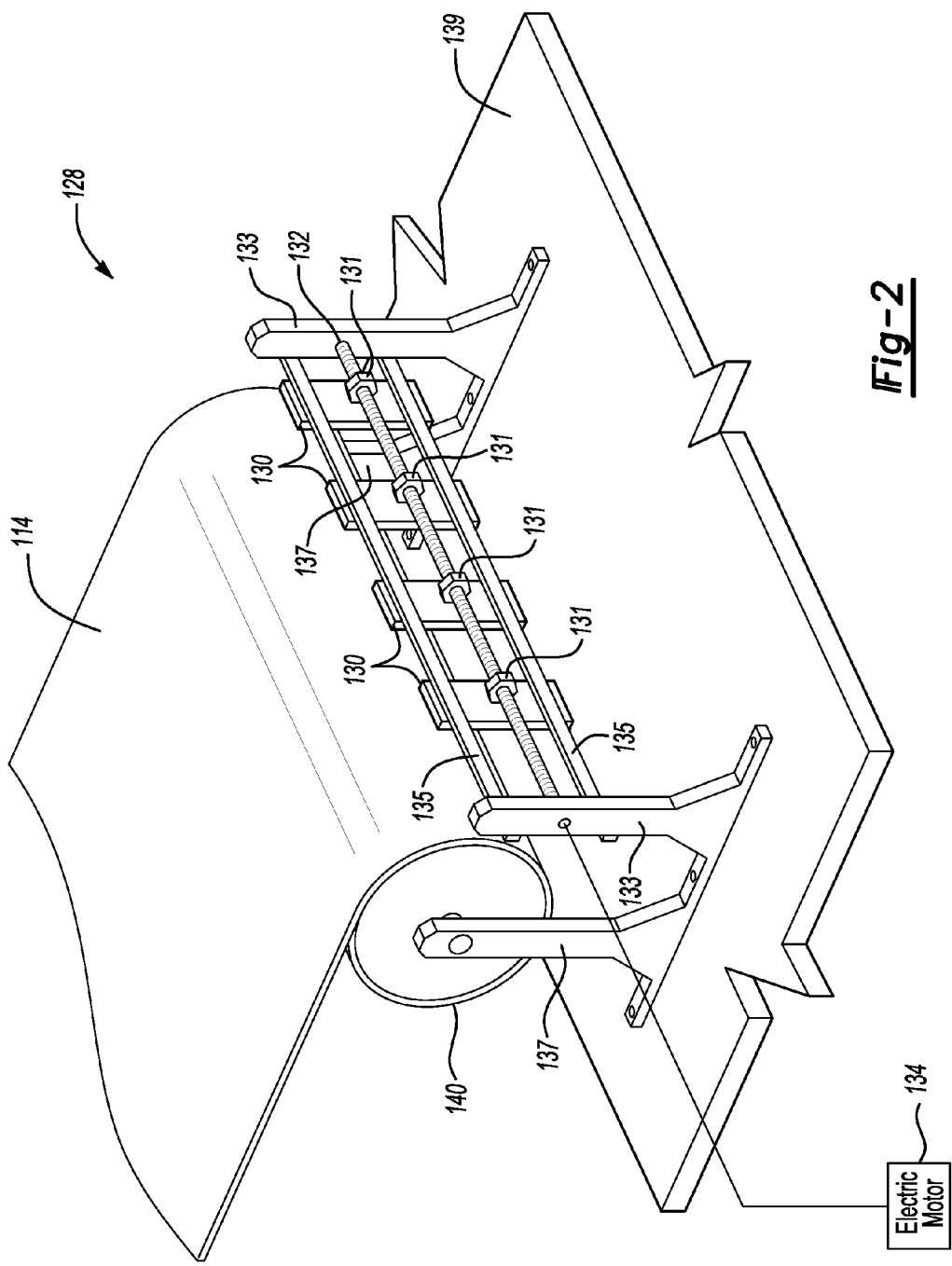
FIG. 2 is a perspective view of an example optical scanner.
Figure 3:
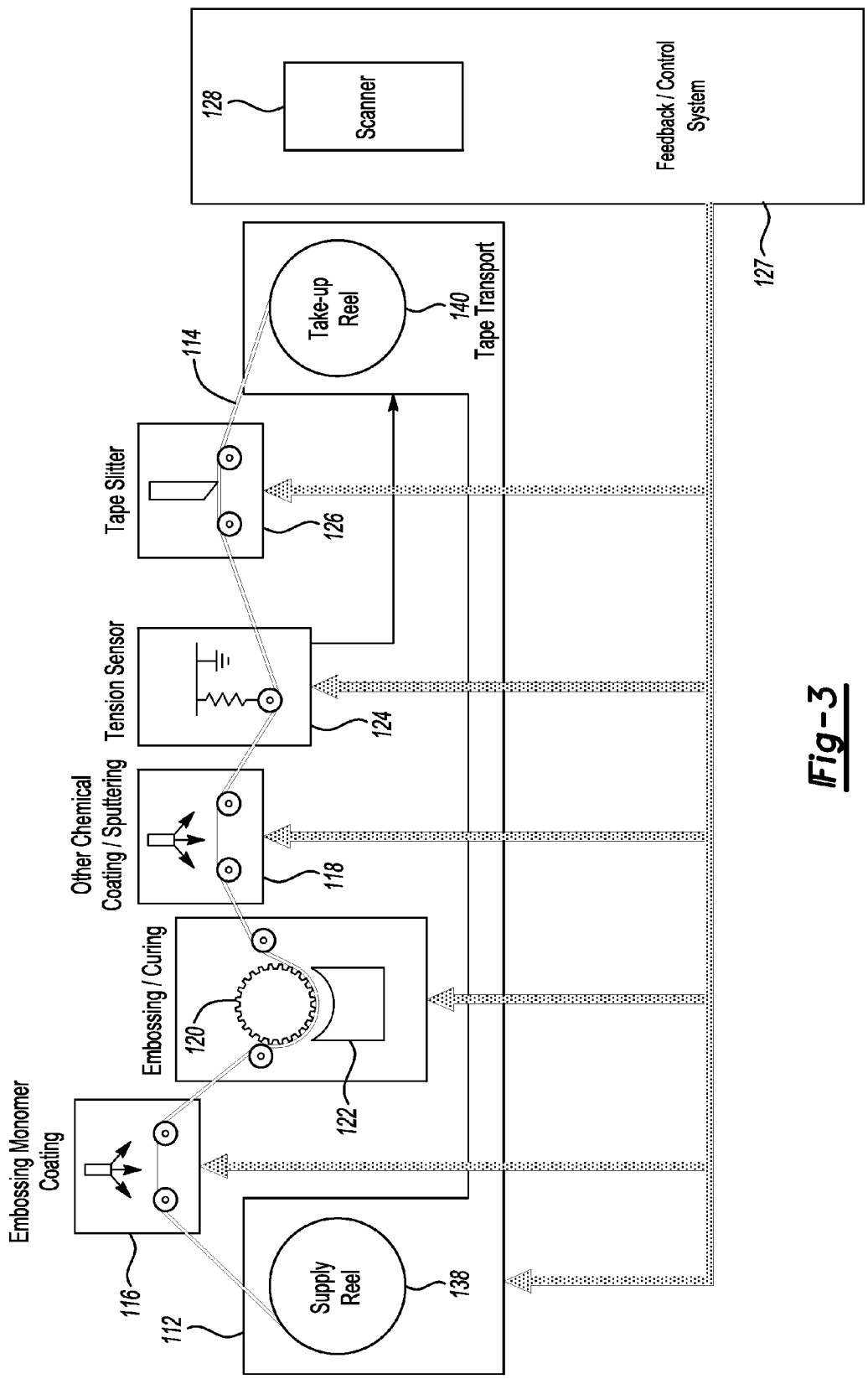
FIG. 3 is a block diagram of another roll-to-roll nano-imprint lithography system.

Referring to FIGS. 2 and 3, an embodiment of a feedback and/or control system 127 may include a pattern sensing stage 128 located after the slitting stage 126. The sensing stage 128, in other embodiments, may be located after any of the stages 116, 118, 120, 124, etc. Multiple sensing stages 128 may also be used. Other arrangements are also possible.

The sensing stage 128 may incorporate an array of (or a single) suitable/known optical pickup units (OPUs) 130 used, for example, for DVD or Blu-Ray drives depending on the media type. The OPUs 130, in this embodiment, are mounted on respective nuts 131. The nuts 131 are threaded on an extended shaft 132 of a lead screw motor 134. The threaded shaft 132 is rotatively supported by posts 133. Stops 135 mounted to and spanning the posts 133 prevent the OPUs 130 (and thus the nuts 131) from rotating as the motor 134 spins the threaded shaft 132 in either direction. As a result, the axial position of the OPUs 130 may be adjusted by rotating the threaded shaft 132. (Posts 137 support a take-up reel 140 for the tape media 114. The posts 133, 137 are each mounted to a base 139.) Of course, other arrangements are also possible.

The OPUs 130 are capable of scanning the surface of the tape media 114 after it has been embossed and coated, sputtered, etc. The scanning is performed by moving the OPUs 130 via the lead screw motor 134 back and forth as the tape 114 is being transported through the different process stages. Any suitable/known OPU arrangement and movement mechanism, however, may be used.

The supporting electronics of the OPUs 130 may, for example, be operated in a standard DVD or Blu-Ray drive mode. Such modes of operation provide track (push/pull), focus and SUM signals that can be used by the scanning mechanism 128 for its proper operation and/or as sensing signals for the feedback/control system 127. These signals exhibit characteristics that are indicative of embossed pattern geometry and layout as well as media quality.

The feedback/control system 127, in certain embodiments, models the desired embossing geometries, etc. with the aid of an internal processor, and computes a set of desired reference signals comparable to the actual sensing signals produced by the sensing stage 128. These computed signals may then be compared with actual sensed signals from the scanner 128. Differences may be used to compute and apply the proper adjustment and/or selection of the operational parameters for the different stages 112, 116, 118, 120, etc. on the fly.

More specifically, the tape media 114 is transported from a supply real 138 to the take-up reel 140 by a set of rotating and guiding motors (not shown). The tape media 114 may be embossed with land and groove patterns indicative of the track location on the tape media 114 during this transport. These patterns are detectable by the scanning OPUs 130. It may be desirable to minimize the lateral motion of the tape media 114 with respect to the stationary rollers.

A single OPU 130 from the scanning station 128, for example, can detect the relative location of land and groove of a reference track(s) and thus the lateral position of the tape media 114 with respect to the stationary rollers. Any deviation from the desired relative position of the tape media 114 is detected as a track error signal by the OPU 130. This error signal can be used by the control/feedback system 127 to manipulate the guiding motors of the transport stage 112 to realign the lateral position of the tape media 114.

During the embossing stage 120, the tape media 114 is embossed with land and groove patterns for track location information and wobble patterns for track address information. The performance of the embossing process can be controlled by nip roller applied pressure and the separation roller position.

The quality and fidelity of the embossed patterns are detectable by the scanning OPUs 130. A scanning OPU 130, as it crosses the embossed land and groove (track) patterns on the tape media 114, generates a periodic (sinusoidal like) signal. This signal has attributes such as peak to peak amplitude, linearity, asymmetry, and spectral content indicative of the land and groove geometry patterns embossed on the tape media 114. This signal from the scanner 128 can then be compared with an optimal desired reference sinusoidal signal. Any difference can be used to generate an error signal to control, via the feedback/control system 127, the nip roller pressure and separation roller relative position to obtain and/or sustain an optimized embossing process.

During the slitting stage 126, similar guiding techniques as explained with respect to the roll-to-roll transport 112 can be applied. That is, the land and groove patterns indicative of track location on the tape media 114 can be used as a reference to ensure that the edge of the cut tape media 114 is parallel to and at a specific distance from the embossed band of land and groove tracks. For example, the scanning OPUs 130 may generate a tracking signal referenced to the land and groove embossed patterns on the tape media 114. The slitting stage's positioning servo system would then be able to utilize this reference signal to position the knife of the slitter parallel to and at a specific distance from a referenced track location on the tape media 114.

During the coating and sputtering stages 116, 118, attributes of the coating and sputtering process such as thickness and uniformity can be detected via the focus signal from the scanning OPUs 130. Any deviation from an optimal focus distance would generate a focus error signal indicative of coating thickness variation, and thus could be used to modify the chemical dispense volume, dispense frequency and/or dispense power to achieve a uniform coating thickness. For example, excessive deviation from an optimal focus error signal detected by the OPUs 130 may be indicative of high frequency of dispense of the coating chemical. The focus error signal generated by the OPUs 130 can thus be used to control the dispense mechanism to optimize the volume and frequency of application of the coating chemicals.

Applying distributed and statistical feedback processes and methods in certain embodiments, may achieve optimum settings for all the operational stages of the process dynamically. Furthermore, it may minimize any deviation or drift from optimum (or near optimum) imprinting performance by automatic readjustment of some/all process parameters.

As apparent to those of ordinary skill, the algorithms disclosed herein may be deliverable to a processing device, which may include any existing electronic control unit or dedicated electronic control unit, in many forms including, but not limited to, information permanently stored on non-writable storage media such as ROM devices and information alterably stored on writeable storage media such as floppy disks, magnetic tapes, CDs, RAM devices, and other magnetic and optical media. The algorithms may also be implemented in a software executable object. Alternatively, the algorithms may be embodied in whole or in part using suitable hardware components, such as Application Specific Integrated Circuits (ASICs), state machines, controllers or other hardware components or devices, or a combination of hardware, software and firmware components.

While embodiments of the invention have been illustrated and described, it is not intended that these embodiments illustrate and describe all possible forms of the invention. The words used in the specification are words of description rather than limitation, and it is understood that various changes may be made without departing from the spirit and scope of the invention.

What is claimed:

1. An optical media production system comprising:
a roll-to-roll tape transport configured to move an optical media;
an optical media nano-imprinting platform having operational parameters and configured to at least one of guide, emboss, coat, and slit the media according to the operational parameters;
an optical scanner configured to detect one or more attributes of the media that result from at least one of the embossing and coating of the media; and
a controller operatively arranged with the scanner and configured to adjust at least one of the operational parameters based on the detected one or more attributes of the media while the platform continues to at least one of guide, emboss, coat, and slit the media, wherein the optical scanner includes at least one optical pick up unit configured to optically scan the optical media and a motor system configured to axially position a shaft held proximate to the optical media and wherein the at least one optical pick up unit is mounted on a nut threaded to the shaft.

2. The system of claim 1 wherein the platform includes a coater to at least one of coat and sputter the optical media and wherein the operational parameters of the coater include at least one of dispense volume, dispense frequency and dispense power.

3. The system of claim 1 wherein the platform includes a slitter to slit the media and wherein the operational parameters of the slitter include cutting element position.

4. The system of claim 1 wherein the platform includes an embosser to emboss the optical media and wherein the operational parameters of the embosser include at least one of nip roller pressure and separation roller relative position.

5. A media production system comprising:
a nano-imprinting system configured to at least one of transport, emboss, coat and slit an optical media according to operational parameters; and
a control system configured to detect one or more attributes of the optical media that result from at least one of the embossing and coating of the optical media, and to adjust at least one of the operational parameters based on the detected one or more attributes while the nano-imprinting system continues to at least one of transport, emboss, coat, and slit the optical media, wherein the control system includes an optical scanner arrangement including at least one optical pick up unit configured to optically scan the optical media and a motor system configured to axially position a shaft held proximate to the optical media and wherein the at least one optical pick up unit is mounted on a nut threaded to the shaft.

6. The media production system of claim 5 wherein the nano-imprinting system includes an embossing stage, a coating stage and a slitting stage, and wherein the optical scanner arrangement is located after the embossing stage, the coating stage and the slitting stage.

7. The media production system of claim 5 wherein the nano-imprinting system includes an embossing stage, a coating stage and a slitting stage, and wherein the optical scanner arrangement is located after the embossing stage and the coating stage, and before the slitting stage.

8. The media production system of claim 5 wherein the nano-imprinting system includes an embossing stage, a coating stage and a slitting stage, and wherein the optical scanner arrangement is located after the embossing stage, and before the coating stage and the slitting stage.

* * * * *